United States Patent
Savukov et al.

(10) Patent No.: US 8,305,078 B2
(45) Date of Patent: Nov. 6, 2012

(54) METHOD OF PERFORMING MRI WITH AN ATOMIC MAGNETOMETER

(75) Inventors: Igor Mykhaylovich Savukov, Los Alamos, NM (US); Andrei Nikolaevich Matlashov, Los Alamos, NM (US); Michelle A. Espy, Los Alamos, NM (US); Petr Lvovich Volegov, Los Alamos, NM (US); Robert Henry Kraus, Jr., Los Alamos, NM (US); Vadim Sergeyevich Zotev, Santa Fe, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 421 days.

(21) Appl. No.: 12/577,010

(22) Filed: Oct. 9, 2009

(65) Prior Publication Data

US 2010/0090697 A1    Apr. 15, 2010

Related U.S. Application Data

(60) Provisional application No. 61/104,081, filed on Oct. 9, 2008.

(51) Int. Cl.
*G01V 3/00* (2006.01)
(52) U.S. Cl. .................... 324/309; 324/307; 324/314
(58) Field of Classification Search .............. 324/309, 324/307, 300, 301, 304
See application file for complete search history.

(56) References Cited

U.S. PATENT DOCUMENTS

| | | | |
|---|---|---|---|
| 4,390,840 A | 6/1983 | Ganssen | |
| 5,038,104 A * | 8/1991 | Wikswo et al. | 324/258 |
| 5,804,967 A | 9/1998 | Miller | |
| 6,159,444 A * | 12/2000 | Schlenga et al. | 424/9.3 |
| 6,577,125 B2 | 6/2003 | Prammer | |
| 6,674,282 B2 | 1/2004 | Pines | |
| 6,885,192 B2 * | 4/2005 | Clarke et al. | 324/300 |
| 7,059,524 B2 | 6/2006 | Knowles | |
| 7,061,237 B2 | 6/2006 | Pines | |
| 7,187,169 B2 | 3/2007 | Clarke | |
| 7,251,310 B2 | 7/2007 | Smith | |
| 7,394,250 B2 | 7/2008 | Itozaki | |
| 7,397,241 B2 | 7/2008 | Gauthausen | |
| 7,541,806 B2 | 6/2009 | Appelt | |
| 7,573,268 B2 | 8/2009 | Volegov et al. | |
| 7,688,069 B2 | 3/2010 | Kraus, Jr. | |

(Continued)

FOREIGN PATENT DOCUMENTS

WO    2008008447    1/2008

OTHER PUBLICATIONS

Bodurka, et al., Toward Direct Mapping of Neuronal Activity: MRI Detection of Ultraweak, Transient Magnetic Field Changes; 47 Magnetic Resonance in Medicine, pp. 1052-1058 (2002).

(Continued)

*Primary Examiner* — Louis Arana
(74) *Attorney, Agent, or Firm* — Meredith H. Schoenfeld; Ryan B. Kennedy

(57) ABSTRACT

A method and apparatus are provided for performing an in-situ magnetic resonance imaging of an object. The method includes the steps of providing an atomic magnetometer, coupling a magnetic field generated by magnetically resonating samples of the object through a flux transformer to the atomic magnetometer and measuring a magnetic resonance of the atomic magnetometer.

16 Claims, 4 Drawing Sheets

U.S. PATENT DOCUMENTS

| 7,729,740 | B2 | 6/2010 | Kraus, Jr. et al. | |
|---|---|---|---|---|
| 7,750,633 | B2* | 7/2010 | Pines et al. | 324/309 |
| 7,826,065 | B1* | 11/2010 | Okandan et al. | 356/521 |
| 2005/0270026 | A1 | 12/2005 | Ganthausen | |
| 2006/0273786 | A1 | 12/2006 | Smith | |
| 2007/0063700 | A1 | 3/2007 | Levitt | |
| 2008/0074113 | A1 | 3/2008 | Clarke | |
| 2008/0284433 | A1 | 11/2008 | Kraus, Jr. et al. | |
| 2009/0289629 | A1 | 11/2009 | Tuchman | |

OTHER PUBLICATIONS

Espy, et al., SQUID-Based Simultaneous Detection of NMR and Biomagnetic Signals at Ultra-Low Magnetic Fields; IEEE Transactions on Applied Superconductivity, vol. 15, No. 2, Jun. 2005, pp. 635-639.

Espy, et al., Ultra-low Field MRI for the Detection of Liquid Explosives Using SQUIDs; IEEE/CSC & ESAS European Superconductivity News Forum, No. 9, Apr. 2009, pp. 1-12.

Matlachov, et al., SQUID detected NMR in microtesla magnetic fields; Journal of Magnetic Resonance, 170 (2004) pp. 1-7.

McDermott, et al., Liquid-State NMR and Scalar Couplings in Microtesla Magnetic Fields; Science Mar. 22, 2002, pp. 2247-2249.

Xiong, et al., Directly Mapping Magnetic Field Effects of Neuronal Activity by Magnetic Resonance Imaging; Human Brain Mapping, vol. 20, pp. 41-49 (2003).

* cited by examiner

METHOD OF PERFORMING MRI WITH AN ATOMIC MAGNETOMETER

The United States government has rights in this invention pursuant to Contract No. DE-AC52-06NA25396 between the United States Department of Energy and Los Alamos National Security, LLC for the operation of Los Alamos National Laboratory.

FIELD OF THE INVENTION

Background of the Invention

Magnetic resonance imaging is a very important diagnostic tool for modern medicine. It is non-invasive, does not involve ionizing radiation (unlike the X-ray counterparts) and is sensitive to soft tissues with various contrast enhancement possibilities. However, MRI has traditionally been performed in very strong magnetic field (typically >1 T) and this presents a number of risk factors during use. For example, patients with various implanted metallic objects (e.g., cochlear implants, brain aneurysm clips, certain artificial heart valves, vascular stents, artificial joints, dental implants) cannot have MRI. MRI is also not recommended in emergency situations, because life-support equipment cannot safely enter the scanner area and the exam can take a very long time. A careful preparation procedure, for example removing all metallic objects, such as jewelry, is necessary before the patient can enter the scanner's room.

Instances of deaths and injuries have occurred due to movement of objects by the fields created by the magnets of conventional MRI devices. While the risk is greatest in the case of implanted devices, there is also risk from any loose metal object in the vicinity of the MRI imaging device.

Many people suffer from claustrophobia and are unable to stay in the confined region of the MRI scanner. In addition, conventional MRI scanners require superconducting magnets which use liquid helium, potentially presenting the hazard of suffocation in the confined region of the MRI scanner if the magnet is quenched and helium gas is released, there by reducing the oxygen level.

In spite of the risks associated with MRI devices, many medical diagnoses could not be made without the information provided by MRI. Accordingly, a need exists for MRI devices without the risks associated with conventional MRI.

SUMMARY

A method and apparatus are provided for performing an in-situ magnetic resonance imaging of an object. The method includes the steps of providing an atomic magnetometer, coupling a magnetic field generated by magnetically resonating samples of the object through a flux transformer to the atomic magnetometer and measuring a magnetic field with the atomic magnetometer.

DETAILED DESCRIPTION OF AN ILLUSTRATED EMBODIMENT

Figure 1:
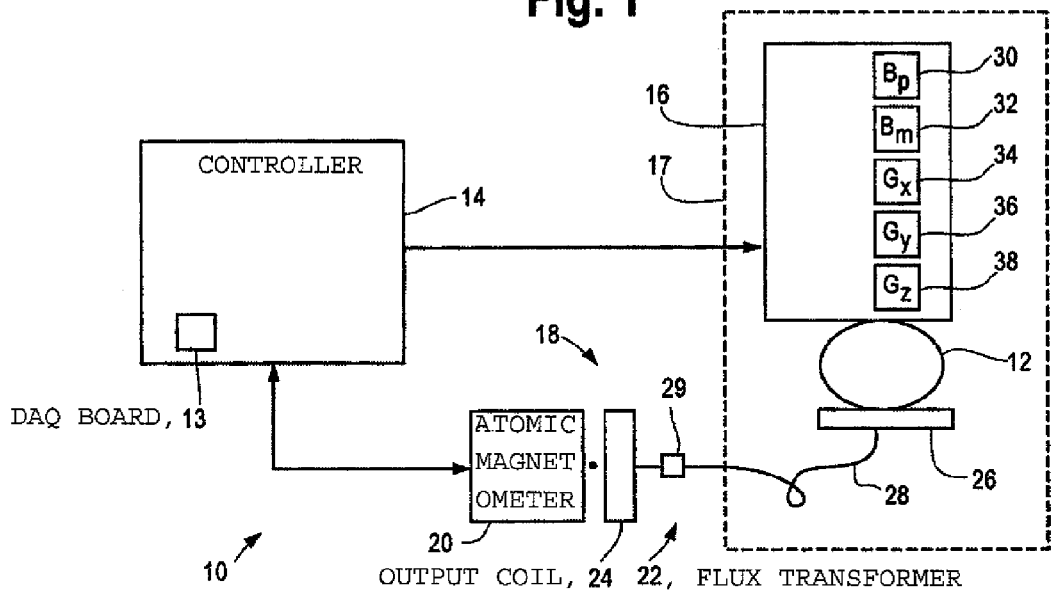
FIG. 1 is a block diagram of a magnetic resonance imaging system in accordance with an illustrated embodiment of the invention.

FIG. 1 is a block diagram of a MRI system 10 shown generally in accordance with an illustrated embodiment of the invention. The system 10 may be used to form two or three dimensional image of object 12. The object 12 may be a person, an animal or inanimate objects.

The system 10 is a non-cryogenic ultra-low-field (ULF) magnetic resonance imaging (MRI) system based on the use of an atomic magnetometer (AM). The system 10 is useful for general biomedical imaging. Ultra-low-field means a magnetic field in the microtesla range. ULF MRI can supplement conventional MRI scanners (i.e. those operating at magnetic fields >1 Tesla) in various applications where high fields are limiting factors. ULF-MRI systems have numerous advantages such as compatibility with magnetoencephalography (MEG), simplified magnetic field generation and field homogeneity requirements, narrow NMR linewidths, decreased susceptibility artifacts, variable field measurements, and the possibility of enhanced tissue contrast. The system 10 has an important advantage over other low field systems due to non-cryogenic operation and immunity to radio frequency (RF) interference. Unlike other systems, a system based on AM does not require any cryogenic infrastructure or optical isolation of electronics and other equipment.

Included within the MRI system 10 is a controller 14, coil assembly 16 and a magnetic resonance detector 18. The coil assembly 16 may include a prepolarization coil ($B_p$) 30, a measurement field coil ($B_m$) 32, a frequency-encoding gradient coil ($G_x$) 34, a phase-encoding gradient coil ($G_z$) 38 and a phase encoding gradient coil ($G_y$) 36. The magnetic resonance detector 18 includes an atomic magnetometer (AM) 20 and a resistive flux transformer 22. While the magnetic resonance detector 18 is shown with a single atomic magnetometer 20 and flux transformer 22 operating together as a pair, it should be understood that any number of pairs of magnetometers 20 and flux transformers 22 may be used for implementing parallel MRI acceleration techniques, such as SENSE.

Figure 2:
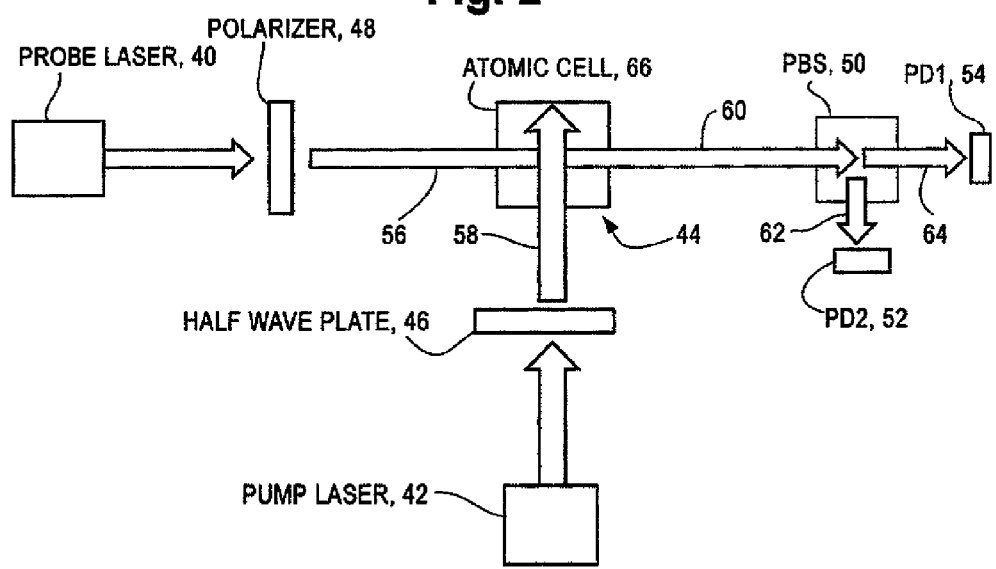
FIG. 2 is an atomic magnetometer that may be used by the system of FIG. 1.

FIG. 2 is a schematic of the atomic magnetometer 20. The atomic magnetometer 20 shown in FIG. 2 is used to detect NMR signals from the object 12 for imaging. The AM 20 may include two lasers 40, 42 that send optical beams into an atomic cell 44. The atomic cell 44 contains a drop of an alkali metal (e.g., potassium) and buffer gases.

One laser 42 may be used to pump alkali-metal atomic spins and the second to probe. Probing in this context means to detect the spin state of the alakali-metal atoms.

The pump laser 42 is tuned to center of the D1 line of potassium (770 nm), while the probe laser 40 is detuned by a few line widths from the center of the D1 line. The optical beam of the pump laser 42 is circularly polarized with a half wave plate 46. The pumping of atomic spins of gas atoms by the optical output from the pump laser 42 occurs because the spin of circularly polarized photons is transferred to atomic spins when the photons are absorbed by the atomic vapor. In effect the atoms are aligned by the optical output of the pump laser 42 to an axis of transmission of the pump laser 42. Alternatively, a bias magnetic field may be used to further align the gas atoms with the pump laser 42. This field is also used to tune the resonance of alkali-metal atomic spins to the frequency of NMR signal.

The optical beam from the probe laser 40 is linearly polarized by a polarizer 48. The polarization of the optical beam from the probe laser 40 is rotated within the cell 44 by the atoms of the reference gas due to non-linear Faraday effect. The two beams 56, 58 intersect inside the atomic cell 44 at the right angle, and the intersection defines the active volume of the AM 20. After exiting the cell 44, the rotated probe beam 60 is sent to a polarizing beam splitter (PBS) 50 to measure the polarization angle of the beam 60. The polarization of the beam 56 is maintained at about 45 degrees so the difference in intensity between the two output beams 62, 64 is proportional to small polarization angle rotation caused by the atoms of the reference gas. The atomic magnetometer essentially measures the projection of atomic spins onto the probe beam polarization.

In terms of overall operation, the coil assembly 16 imparts a gradient echo sequence to the object 12 causing the object 12 to generate a NMR signal. The flux transformer 22 couples the magnetic flux of the NMR signal to the AM 20 causing the alkali-metal spins to resonate in sympathy with the nuclear spins of the sample 12. The probe beam measures the NMR signal via the disturbances imparted to the polarization of the probe beam.

In the presence of the bias field, the alkali-metal atomic spins precess, and their projection along the probe beam (i.e., the polarization) oscillates with the precession frequency. The behavior of the atomic spins can be well described by the Bloch equation. The solution of the Bloch equation for a small oscillating field exhibits a Lorentzian resonance. This resonance can be tuned with the bias field.

Ambient fields can affect the operation of the magnetometer 20. For example, shifting the magnetic resonance or increasing a noise level at the working frequency can effect the magnetometer 20. To alleviate this, the magnetometer is supplied with a ferrite shield 66 that enables operation of the magnetometer in the presence of ambient fields and noise. Ferrite is chosen instead of mu-metal because of higher resistance so that eddy currents and Johnson noise are not significant.

Bias field coils (not shown) may be provided for tuning the magnetometer to the NMR frequency. The bias field coils may be located outside the ferrite shield 66, instead of inside.

Because the optimal performance of the AM 20 is reached at an atomic cell temperature of around 200 C, the cell 44 may be heated. The cell 44 may be heated with an electrical heating element.

Figure 3:
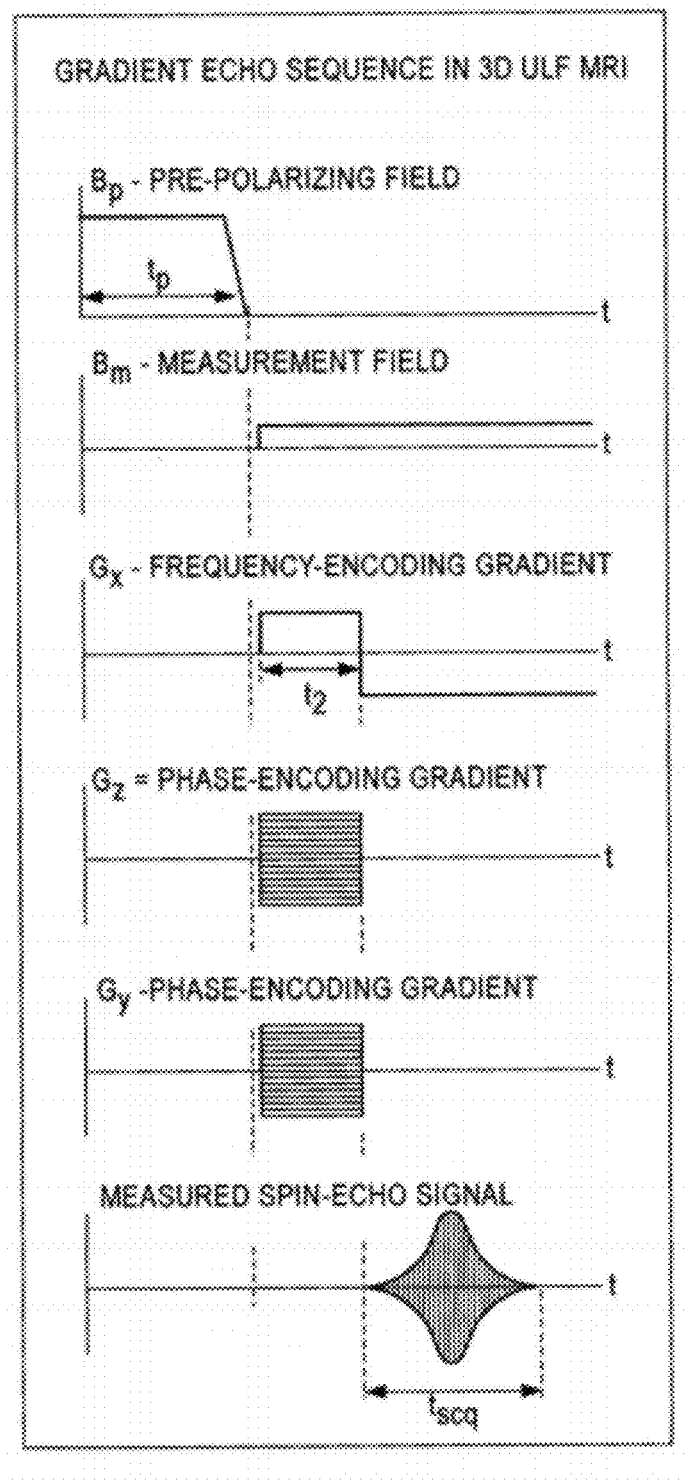
FIG. 3 is a gradient echo sequence that may be used by the system of FIG. 1.

One difficulty in the direct detection of NMR signals with an AM 20 is that the MRI fields and gradients used to generate the NMR signals may also interfere with the operation of an AM 20. At least one magnetic field $B_m$ and one gradient $G_x$ are present during the data acquisition cycle of the NMR signals, as shown in FIG. 3. It is possible to protect the magnetometer from the NMR measurement fields by enclosing either the atomic cell or the NMR sample with a long high-quality solenoid, which can produce a more or less uniform field inside the solenoid with minimum fields outside. However, to compensate for the solenoid gradients, additional coils would be required which complicates the system arrangement. Moreover, enclosing the sample with a long solenoid restricts some in vivo experiments and if the NMR frequency is high, the solenoid field non-uniformity can significantly shorten $T_2^*$. On the other hand, enclosing the atomic cell requires modifications in the design of the oven 68. A much simpler solution, used herein, is to use a flux transformer (FT) 22. The FT 22 completely decouples gradients and NMR fields generated by the object 12 from the field environment of the AM 20, but transfers the AC magnetic field at the NMR frequency.

Figure 4:
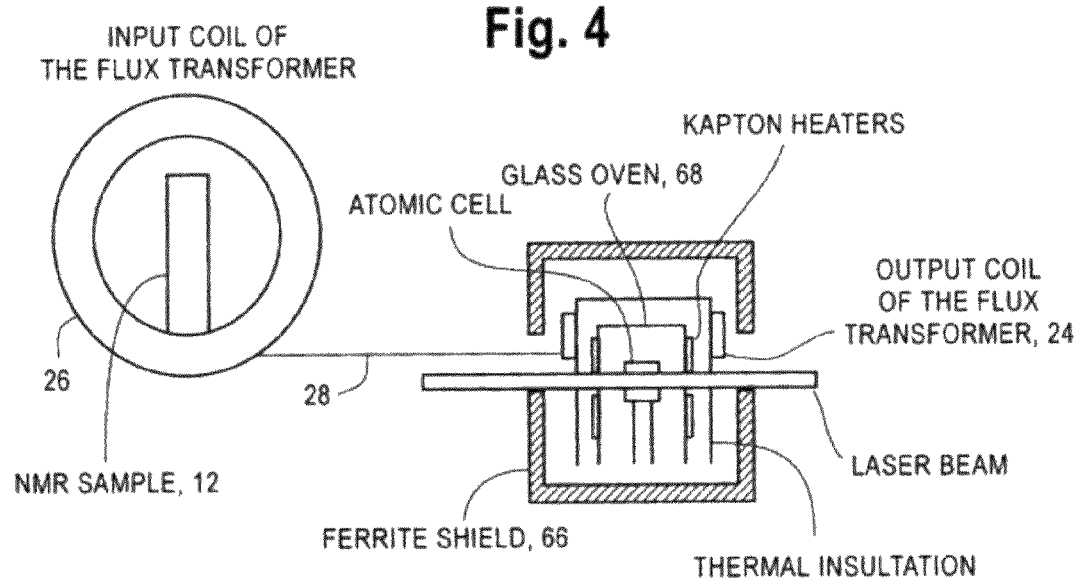
FIG. 4 is a side cut-away view of the atomic magnetometer of FIG. 2.

In addition, the FT 22 allows for flexible arrangement of the AM 20 and MRI systems. Moreover, it is possible by reducing the area of the output coil of the flux transformer 22, by optimizing the number of turns in the coils, and by adding a capacitor 29 in series with the coils for tuning the resonance of the FT 22 to the NMR frequency to enhance a signal quality of the field of the output coil 24 of the FT 22 and hence to reduce demand on the sensitivity of the AM 20. The lower requirement for sensitivity of the AM 20 allows considerable simplifications in the design. In particular, a less efficient magnetic shield, lasers of lower quality and cost, a portable optical platform, and an electrical oven 68 can be used:

FIG. 4 is a simplified schematic of the atomic magnetometer 20 and flux transformer 22 under one illustrated embodiment of the invention. As noted above, the FT 22 consists of two coils 24, 26 connected by a pair of twisted wires 28 with a capacitor 29 connected in series. The input coil 26 of the FT 22 is located near the NMR sample 12, at some distance from the AM 20. The second, output coil 24 is located inside the ferrite box 66 of the AM 20, mounted on the external surface of the oven 68, slightly above the center so as not to block the probe and pump beams 56, 58 passing through the cell 44. This is not optimal in terms of field enhancement, but convenient for implementation and making on-the-fly adjustments needed in the process of optimization.

Figure 6:
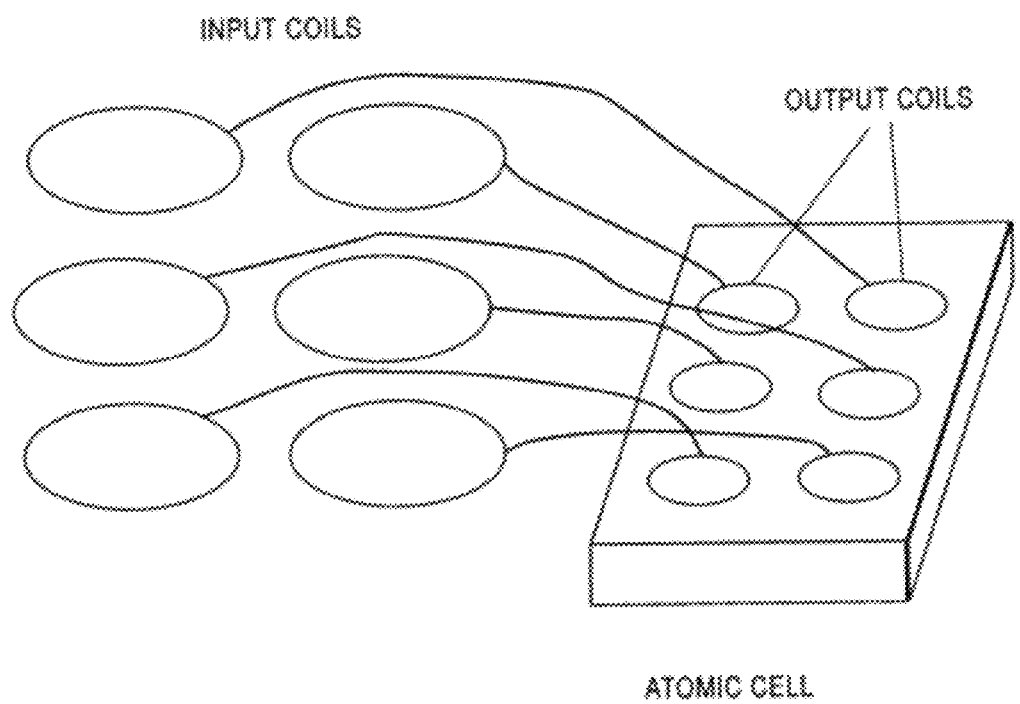
FIG. 6 is a side perspective view of a multichannel NMR signal detector that may be used with the system of FIG. 1.

However, nothing prevents a user from positioning the output coil 24 very close to the atomic cell 44 to increase field enhancement. Placing the output coil 24 very close to the atomic cell 44 allows for the construction of a number of atomic magnetometers within and to realize a multi-channel system with one large cell 44, as depicted by the six AMs within the atomic cell shown in FIG. 6. Up to 100 channels may be formed within a relatively large atomic cell (50 mm by 50 mm by 5 mm). Multiple flux transformers may be coupled efficiently to various atomic cell regions within the cell 44, which can detect fields independently due to slow diffusion of alkali-metal atoms in the cell in the presence of buffer gas (1 atm of helium). Such arrangement may be used to implement parallel MRI acceleration based on the SENSE algorithm.

The sensitivity to the NMR signal is determined by the geometry of the input coil 24 of the FT 22. Input coils 26 may be constructed with any of a number of different configurations. For example, a first exemplary input coil may be made of multi-strand wire with 200 turns and a resistance of about 2 ohm. Alternatively a second exemplary input coil may be made of 1 mm wire with 240 turns and a resistance of about 3 ohm. These exemplary input coils 26 provide similar results; however, the second exemplary coil 26 was made with a smaller diameter than the first exemplary input coil 26 for insertion adjacent the Bp coil box with the orientation perpendicular to the Bp and the Bm coils (see FIG. 5). This is important for reducing transients due to switched field. The coil design may be optimized for different MRI experiment. For instance, for MRI experiments involving a human hand, it will be disposed around the hand. This improves SNR, which depends on the distance from the coil wire to the source. For the MRI involving a human head, the coil diameter may be made large enough to cover the necessary depth of the head (the sensitivity of a coil does not change much when distance does not exceed the diameter of the coil).

The resistive flux transformer (if the small self-capacitances of its coils are ignored) is relatively simple for theoretical analysis. The output $F_{out}$ and input $F_{in}$ fluxes are related by the following equation, $$F_{out} = F_{in} \frac{j\omega L_{out}}{j\omega(L_{in} + L_{out}) + R}, \quad (1)$$

where $L_{in}$ is the inductance of the input coil, $L_{out}$ is the inductance of the output coil, R is the total resistance of the transformer, and ω is the frequency. At sufficiently high frequencies at which the resistance can be neglected, this equation can be used to show that the FT 22 sensitivity improves linearly with the radius of the pick-up coil. This is due to the fact that the input flux for a given field grows with the area, but the input inductance grows with the first power of the coil diameter, so the overall gain in the sensitivity is one power of the diameter of the input coil. By adding a capacitor in sequence, the field gain obtained with the help of the flux transformer can be further increased because the capacitor can compensate for the reactive resistance due to inductance of the coils (reduces the denominator of the equation as follows), $$F_{out} = F_{in} \frac{j\omega L_{out}}{j\omega(L_{in} + L_{out}) + R - j/\omega C}. \quad (2)$$

At resonance $\omega(L_{in}+L_{out})=1/\omega C$ and $$F_{out} = F_{in} \frac{j\omega L_{out}}{R} \approx Q \frac{j\omega L_{out}}{\omega(L_{in}+L_{out})} \quad (3)$$

This means that the output flux is further enhanced Q times compared to Eq. 1, where Q is the quality factor. This property of a flux transformer has been experimentally investigated and used to achieve a significant increase of the field enhancement, on the order of 50. Even higher factors can be obtained by increasing Q and by decreasing the output coil area. If the flux transformer is used to increase the field at the AM by 50 times, then the sensitivity needed from the atomic magnetometer to achieve 1 fT/Hz$^{1/2}$ will be only 50 fT/Hz$^{1/2}$. Thus the portable magnetometer 20 described herein is sufficient to reach sensitivities in the input from the FT 22 equal to 1 fT/Hz$^{1/2}$. However, higher sensitivities also can be achieved with an increase of the enhancement factor. This might not need any design changes but only an increase in frequency, because Q and the enhancement factor increase with frequency. The limit on Q in MRI applications might be set by bandwidth, but at 30 kHz operation frequency, this limit is not very restrictive.

Figure 5:
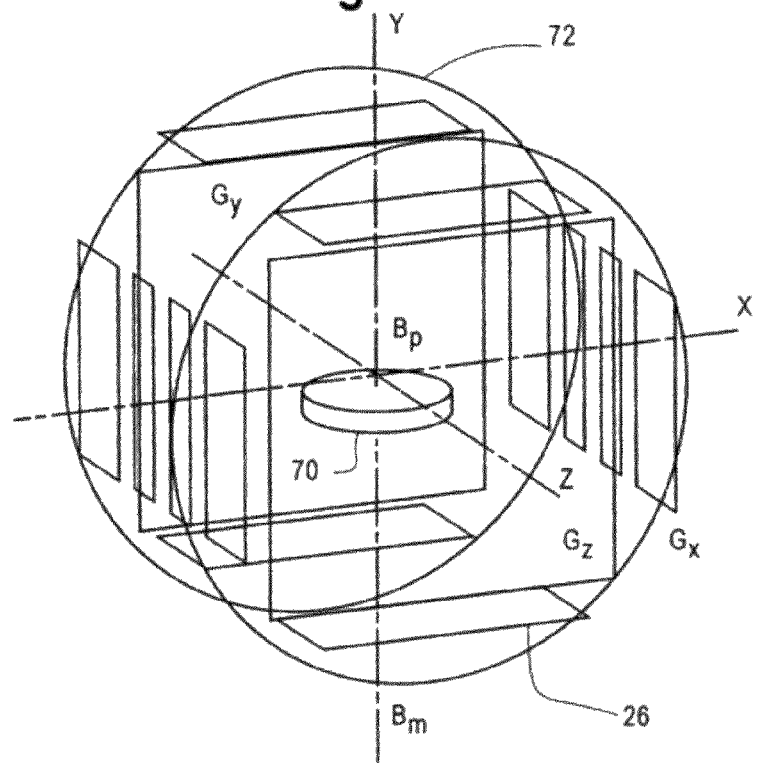
FIG. 5 is a side perspective view of an coil array that may be used by the system of FIG. 1.

The overall coil subsystem is shown in FIG. 5. The prepolarization coil, Bp, 70 is used to prepolarize an MRI sample 12. It is capable of delivering field up to 100 mT, although it is normally used at 40 mT. The $B_m$ coils 72 (provided in a Helmholtz configuration) create uniform MRI and NMR field, which determine the precession frequency. The gradient coils (all the other coils) produce 3 gradients necessary for 3D imaging. In use, the system 10 may be used with a relatively standard excitation protocol (as shown in FIG. 3). First, the prepolarizing field Bp (the top trace) is turned on for a time $t_p$, comparable to T1, to polarize the sample and deactivated with a ramp down of a few ms. The deactivation or turning off rate depends on the inductance of the coil and the current. After a small delay (typically 5-10 ms) $B_m$, which is perpendicular to $B_p$, is activated (the next trace) and nuclear spins start to precess. The non-adiabatic switching of the $B_m$ field is equivalent to a non-selective π/2 pulse. Some delay between the time when $B_p$ is off and the time when $B_m$ is switched on is necessary to have well controlled excitation of transverse magnetization and to avoid random fluctuations of the phase of NMR signal. The frequency Gx and phase-encoding Gy and Gz gradients are used to cover 3D k-space. For 2D imaging, the Gz gradient is disconnected. If multi-channel detection is used with the SENSE reconstruction method, the omission of some lines in k-space can be used to accelerate the MRI scan. The fixed $G_x$ gradient is activated simultaneously with $B_m$, and its polarity is reversed after time $t_g$ to produce the gradient echo. Phase encoding gradients along z and y directions are applied simultaneously with the positive lobe of $G_x$. The time of appearance of the echo is determined by the strength of the $G_x$ gradient, and typically the echo time is chosen in the range 30-1000 ms. For in vivo imaging, the echo time is required to be less than the $T_2$ relaxation time, which for tissues is about 100 ms. The signal from the AM 20 is acquired by the controller 14 through a DAQ board 13. The controller 14 controls application of the MRI excitation pulses through a magnetic controller 16. The controller 14 controls acquisition, and data processing from the detector 18 at least partially through the DAQ board 13. Data processing in this case includes time averaging, filtering, slow-drift background subtraction, and FFT. All software is for the most part conventional and can be modified to address changing experimental needs. In particular, a user can increase the number of channels and implement the SENSE reconstruction algorithm for an arbitrary number of channels. The pulse sequences, time delays, and electronics can be also modified. While currently, the system 10 does not use rf excitation pulses, it is possible to arrange spin-echo protocols.

The output of the AM 20 is measured with the photodetectors 52, 54 which differential signal is amplified and acquired with a DAQ with a sampling frequency at least twice the precession frequency of the atoms of the sample 12. A Fourier processor may be used to process the frequency content of the detected signal. One or more notch filters may be used to recover the signal magnitude for each voxel within the object 12 at the Larmour frequency of the samples within the voxel. Using the sample value of each voxel, a three dimensional map of the sample object 12 may be created.

In another illustrated embodiment, the MRI scanner (e.g., the coil assembly, object 12, FT coil 26, etc) is enclosed in a metal (e.g. steel) box to further improve sensitivity of the system 10. In this case, the shield 17 operates to suppress outside magnetic fields and noise and also to contain the magnetic fields generated in the scanning process.

A specific embodiment of method and apparatus for magnetic resonance imaging has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention and any and all modifications, variations, or equivalents that fall within the true spirit and scope of the basic underlying principles disclosed and claimed herein.

The invention claimed is:

1. An apparatus for performing an in-situ magnetic resonance imaging of an object comprising:
   a magnetic resonance imaging system comprising a controller and a coil assembly configured to induce magnetic resonance in the object;
   an atomic magnetometer comprising an atomic cell disposed within a shield; and a flux transformer that couples a magnetic field generated by magnetically resonating samples of the object to the atomic magnetometer for measurement of a nuclear magnetic resonance field of the resonating samples from the coupled magnetic field, the flux transformer comprising: an input coil disposable substantially adjacent the object, an output coil disposed within the shield, and a capacitor serially connected to the input coil and the output coil.

2. The apparatus for performing an in-situ magnetic resonance imaging as in claim 1 wherein the atomic magnetometer further comprises a reference gas disposed within the atomic cell.

3. The apparatus for performing an in-situ magnetic resonance imaging as in claim 2 wherein the reference gas further comprises an alkali-metal.

4. The apparatus for performing an in-situ magnetic resonance imaging as in claim 2 wherein the atomic magnetometer further comprises a pump laser that pumps the atoms of the reference gas.

5. The apparatus for performing an in-situ magnetic resonance imaging as in claim 4 wherein the pump laser further comprises a half wave plate that circularly polarizes an output of the pump laser.

6. The apparatus for performing an in-situ magnetic resonance imaging as in claim 5 wherein the atomic magnetometer further comprises a probe laser with an output beam of the probe laser oriented to pass through the reference gas at a right angle to an output of the pump laser.

7. The apparatus for performing an in-situ magnetic resonance imaging as in claim 6 further comprising a polarizer that linearly polarizes the output beam of the probe laser.

8. The apparatus for performing an in-situ magnetic resonance imaging as in claim 7 further comprising a polarizing beam splitter oriented at 45 degrees to the output beam for the probe laser.

9. The apparatus for performing an in-situ magnetic resonance imaging as in claim 8 further comprising first and second optical detectors that measure a rotation of the probe laser caused by the reference atoms from an output of the polarizing beam splitter.

10. The apparatus for performing in-situ magnetic resonance imaging as in claim 1, further comprising a heater disposed substantially adjacent to the atomic cell.

11. The apparatus for performing in-situ magnetic resonance imaging as in claim 1, wherein the input coil comprises: a multi-strand wire of approximately 1 mm diameter, rolled between 200 and 240 turns, and having a resistance ranging between 2 and 3 Ohms.

12. An apparatus for performing an in-situ magnetic resonance imaging of an object comprising:
a magnetic resonance imaging system comprising a controller and a coil assembly configured to induce magnetic resonance in the object;
an atomic cell disposed within a ferrite shield and comprising a reference gas;
a flux transformer that magnetically couples resonating samples of the object to the reference gas, the flux transformer comprising an input coil disposable substantially adjacent the object and an output coil disposed within the ferrite shield;
a pump laser that pumps atomic spins of the reference gas;
a probe laser with an optical polarization that is rotated by the reference gas due to a non-linear Faraday effect; and
a sensor that measures a projection of atomic spins of the reference gas onto a probe beam direction of the probe laser.

13. The apparatus for performing an in-situ magnetic resonance imaging as in claim 12 wherein the flux transformer further comprises a capacitor disposed in series between the input coil and the output coil.

14. The apparatus for performing an in-situ magnetic resonance imaging as in claim 12 further comprising an enclosure that substantially surrounds: the object, the MRI coil assembly, and the input coil of the flux transformer.

15. The apparatus for performing in-situ magnetic resonance imaging as in claim 12, further comprising a heater disposed substantially adjacent to the atomic cell.

16. The apparatus for performing in-situ magnetic resonance imaging as in claim 12, wherein the input coil comprises: a multi-strand wire of approximately 1 mm diameter, rolled between 200 and 240 turns, and having a resistance ranging between 2 and 3 Ohms.

* * * * *